United States Patent
Gauthier et al.

(10) Patent No.: US 11,276,752 B2
(45) Date of Patent: Mar. 15, 2022

(54) METHOD FOR FORMING A DEVICE COMPRISING A BIPOLAR TRANSISTOR

(71) Applicant: STMicroelectronics (Crolles 2) SAS, Crolles (FR)

(72) Inventors: Alexis Gauthier, Meylan (FR); Pascal Chevalier, Chapareillan (FR); Gregory Avenier, Saint Nazaire les Eymes (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/995,054

(22) Filed: Aug. 17, 2020

(65) Prior Publication Data

US 2021/0057520 A1    Feb. 25, 2021

(30) Foreign Application Priority Data

Aug. 19, 2019  (FR) ...................................... 1909282

(51) Int. Cl.
*H01L 29/06*  (2006.01)
*H01L 29/66*  (2006.01)
*H01L 29/732* (2006.01)

(52) U.S. Cl.
CPC .... *H01L 29/0642* (2013.01); *H01L 29/66234* (2013.01); *H01L 29/7322* (2013.01)

(58) Field of Classification Search
CPC ........... H01L 29/0642; H01L 29/66234; H01L 29/7322; H01L 29/66272; H01L 29/732; H01L 29/66287; H01L 29/0821; H01L 29/1004; H01L 29/165; H01L 29/66242; H01L 29/7371; H01L 29/0649
See application file for complete search history.

(56) References Cited

U.S. PATENT DOCUMENTS

| | | | |
|---|---|---|---|
| 2004/0058503 A1 | 3/2004 | Cha | |
| 2010/0022056 A1* | 1/2010 | Donkers | H01L 29/66242 438/207 |
| 2010/0327280 A1 | 12/2010 | Joseph et al. | |
| 2013/0270649 A1* | 10/2013 | Chantre | H01L 29/73 257/378 |
| 2014/0167116 A1* | 6/2014 | Chevalier | H01L 27/0623 257/197 |
| 2017/0288042 A1 | 10/2017 | Dahl et al. | |
| 2018/0197781 A1 | 7/2018 | Chevalier et al. | |

FOREIGN PATENT DOCUMENTS

| | | |
|---|---|---|
| DE | 102014113989 A1 | 3/2016 |
| DE | 102015204411 A1 | 9/2016 |
| GB | 2425400 A | 10/2006 |
| JP | S60117664 A | 6/1985 |

OTHER PUBLICATIONS

INPI Search Report and Written Opinion for FR 1909282 dated Apr. 21, 2020 (10 pages).

* cited by examiner

*Primary Examiner* — Wasiul Haider
(74) *Attorney, Agent, or Firm* — Crowe & Dunlevy

(57) ABSTRACT

A device including a transistor is fabricated by forming a first part of a first region of the transistor through the implantation of dopants through a first opening. The second region of the transistor is then formed in the first opening by epitaxy.

16 Claims, 8 Drawing Sheets

METHOD FOR FORMING A DEVICE COMPRISING A BIPOLAR TRANSISTOR

PRIORITY CLAIM

This application claims the priority benefit of French Application for Patent No. 1909282, filed on Aug. 19, 2019, the content of which is hereby incorporated by reference in its entirety to the maximum extent allowable by law.

TECHNICAL FIELD

The present disclosure relates generally to electronic devices and, more specifically, to electronic devices comprising transistors.

BACKGROUND

The transistor is an electronic component used in most circuits or electronic devices. Several types of transistors exist.

A bipolar transistor is a semiconductor-based electronic device from the family of transistors. Its operating principle is based on two PN junctions, one that is direct and the other that is reversed.

There is a need in the art to addresses all or some of the drawbacks of known devices comprising a transistor.

There is a need in the art to address all or some of the drawbacks of known methods for manufacturing devices comprising a transistor.

SUMMARY

One embodiment provides a method for forming a device comprising a transistor, the method comprising: a) forming a first part of a first region of the transistor by implanting dopants through a first opening; and b) forming a second region of the transistor in the first opening by epitaxy.

According to one embodiment, the method comprises, before steps a) and b): c) forming an isolating trench in a substrate.

According to one embodiment, the method comprises, between steps c) and a): d) forming, by implantation, a second part of the first region, extending below the isolating trench; and e) forming the first opening in the isolating trench.

According to one embodiment, the method comprises, after step b): f) forming a third region of the transistor on the second region; and g) forming a spacer on the lateral surfaces of the third region.

According to one embodiment, the transistor is a bipolar transistor, the first region being a collector region, the second region being a base region and the third region being an emitter region.

According to one embodiment, the method comprises, between steps c) and a): d) forming, by implantation, a second part of the first region, extending below the isolating trench; and e) forming a second opening in the isolating trench.

According to one embodiment, the method comprises, between steps e) and a): f) forming a third region in the second opening by epitaxy.

According to one embodiment, the transistor is a bipolar transistor, the first region being a collector region, the second region being an emitter region and the third region being a base region.

According to one embodiment, the method comprises, between steps f) and a): g) forming a stack of at least one isolating layer on the third region; and h) forming the first opening in the stack.

According to one embodiment, the method comprises forming spacers on the lateral surfaces of the second region.

According to one embodiment, the width of the spacers is greater than about 40 nm.

Another embodiment provides a device comprising a transistor, the transistor comprising a first part of a first region and a second region located facing one another and having substantially equal horizontal dimensions.

According to one embodiment, the lateral surfaces of the second region are in contact with an isolating trench.

According to one embodiment, the first part and the second region are in contact.

According to one embodiment, the transistor comprises a third region located on the second region.

According to one embodiment, the transistor is a bipolar transistor, the first region being a collector region, the second region being a base region and the third region being an emitter region.

According to one embodiment, the lateral surfaces of the second region are in contact with spacers.

According to one embodiment, the transistor comprises a third region separating the first part and the second region.

According to one embodiment, the transistor is a bipolar transistor, the first region being a collector region, the second region being an emitter region and the third region being a base region.

According to one embodiment, the height of the first part of the first region is greater than 50 nm, the height of the second region is between 50 and 100 nm, and the height of the third region is between 50 and 100 nm.

According to one embodiment, the first region comprises a second part, the horizontal dimensions of which are greater than the horizontal dimensions of the first part.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

The isolating elements (layers, walls, trenches, etc.) are, for example, made from silicon oxide or silicon nitride.

Figure 1:
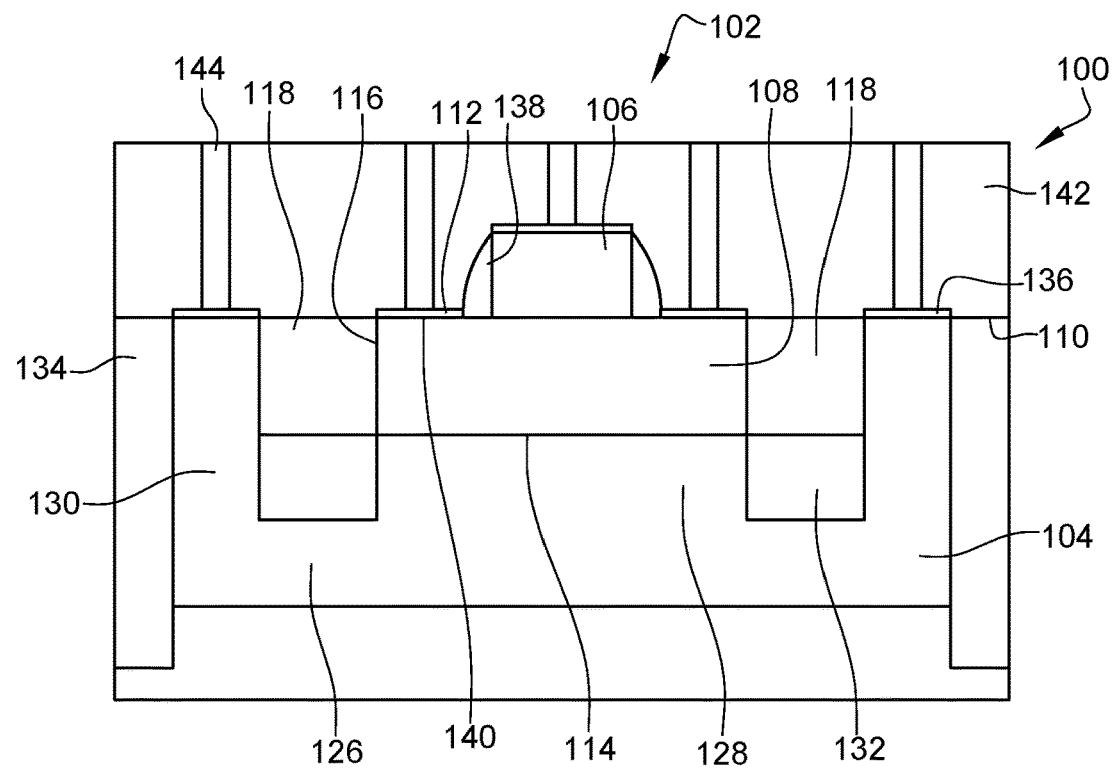
FIG. 1 is a sectional view of one embodiment of a device comprising a transistor.

FIG. 1 is a sectional view of one embodiment of a device 100 comprising a transistor 102.

The device 100 comprises a semiconductor substrate. The semiconductor substrate is, for example, made from silicon. Preferably, the substrate is not doped (for example, intrinsic).

A non-doped semiconductor material refers to a material having a doping concentration less than about $10^{17}$ dopants/$cm^3$.

The transistor 102 in this example is a bipolar transistor. In this example, the transistor 102 is of the PNP type. As a variant, the transistor could be a bipolar transistor of the NPN type, the doping types of the different semiconductor regions then being reversed.

The transistor 102 comprises three regions. The transistor 102 comprises first, second and third regions, respectively a collector region 104, an emitter region 106 and a base region 108.

The base 108 and collector 104 regions are buried regions, that is to say, the regions 104 and 108 are located in the substrate. The regions 104 and 108 of the transistor are therefore located below an upper face 110 of the substrate. The upper face 110 is preferably planar, at least at the transistor 102. For example, the upper face of the substrate is substantially parallel to a lower face of the substrate.

In the example of FIG. 1, the collector region 104 is located below the base region 108. The emitter region 106 is located on the base region 108. The emitter region 106 is on the upper face 110 of the substrate.

The base region 108 is, for example, substantially flush with the upper face 110 of the substrate. The upper face of the base region 108 is, for example, substantially coplanar with the upper face 110 of the substrate.

The base region 108, for example, has a substantially parallelepiped shape, or a substantially cylindrical shape. In the section plane of FIG. 1, the base region 108 has an upper face 112, a lower face 114, and two lateral surfaces 116. The upper face is a face substantially coplanar with the upper face 110 of the substrate. The lower face is parallel to the upper face. The lateral surfaces 116 are, for example, substantially perpendicular to the upper and lower faces. The lateral surfaces link the upper and lower faces.

The base region 108, for example, has a height (thickness) of between about 50 and about 100 nm. The width of the base is, for example, greater than about 300 nm, preferably greater than about 500 nm, and for example less than about 1 μm.

"Height" refers to the dimension in the direction orthogonal to the plane of the upper face of the substrate. The height of the base region is therefore the distance between the upper face of the base region 108 and the lower face of the base region 108. Preferably, the height is the dimension in the direction orthogonal to the plane of the upper face of the substrate in the location where the dimension is maximal.

"Width" refers to the dimension, in the plane of FIG. 1, in a direction parallel to that of the upper face of the substrate. The width is therefore the distance between the lateral surfaces 116. Preferably, the width is the distance between the lateral surfaces 116 in the location where the distance is maximal.

The base region is made from a semiconductor material. In the example of FIG. 1, the base region is made from an N-doped semiconductor material, preferably doped silicon germanium (SiGe) material. The base region is, for example, doped with arsenic or phosphorus. The doping of the base region is, for example, between about $5*10^{18}$ and about $10^{19}$ dopants/$cm^3$.

The base region 108 is surrounded by an isolating trench 118. The isolating trench is, for example, a trench of the SSTI (Super Shallow Trench Isolation) type. The isolating trench 118 is preferably made from a ring around the base region 108.

The trench 118 extends over the entire height of the base region 108. Preferably, the isolating trench does not cover the upper face of the base region 108. Preferably, the isolating trench does not cover the lower face of the base region 108.

The height of the isolating trench 118 is preferably substantially equal to the height of the base region 108. The upper face of the isolating trench is preferably substantially coplanar to the upper face of the base region 108. The lower face of the isolating trench 118 is preferably substantially coplanar to the lower face 114 of the base region 108.

The collector region 104 comprises several parts: a primary part 126, a secondary part 128 and connecting branches 130.

The secondary part 128 is located in contact with the base region 108. The secondary part 128 is separated from the emitter region 106 by the base region. The secondary part 128 is located facing the base region 108.

The dimensions, in a plane parallel to the upper face 110 of the substrate, of the base region and the secondary part 128 are substantially equal. The base region 108 and the secondary part 128 of the collector region 104 are therefore substantially aligned. In other words, each lateral surface 116 of the base region 108 is substantially aligned with a lateral surface of the secondary part 128. Each lateral surface 116 of the base region 108 is therefore substantially in a same plane as a lateral surface of the secondary part 128.

The height (thickness) of the secondary part 128 is, for example, greater than 50 nm, for example between about 50 nm and about 150 nm, preferably about 100 nm.

The secondary part 128 is, for example, surrounded by regions 132 of semiconductor material, for example regions of the semiconductor substrate. The regions 132 of semiconductor material are preferably not doped. The secondary part 128 is therefore in contact with the regions of semiconductor material 132 by at least two lateral surfaces, for example the lateral surfaces in the plane of FIG. 1, preferably by all of the surfaces. The regions 132, for example, form a ring around the secondary part 128. The upper face of the regions 132 is, for example, substantially coplanar with the upper face of the secondary part 128 and with the lower face of the base region 108.

The primary part 126 is preferably a substantially horizontal layer, that is to say, a layer extending in a plane, for example, substantially parallel to the upper face 110 of the substrate or in a plane substantially parallel to the upper face of the base region 108. The primary part 126 is preferably a continuous layer. The primary part 126 therefore preferably does not comprise an opening. The lower and upper faces of the primary part 126 are, for example, substantially parallel and preferably substantially planar.

The primary part 126 is in contact with the secondary part 128. The primary part 126 is mechanically and electrically connected to the base region 108 by the secondary part 128. Around the secondary region 128, the primary part 126 is separated from the isolating trench 118 by the semiconductor material regions 132.

The connecting branches 130, for example, form a ring around the isolating wall 124 and the regions 132. The connecting branches 130 preferably correspond to a continuous wall surrounding the isolating wall 124 and the regions 132. As a variant, the ring may comprise several branches that are separate from one another and separated from one another by isolating walls that are not shown.

The connecting branches 130, separate or in the form of one continuous wall, extend in a direction substantially orthogonal to the plane in which the primary part 126 extends. The branches 130 extend along lateral surfaces of the trench 118 and regions 132. The branches 130, for example, extend substantially from the upper face 110 of the substrate substantially to the level of the lower face of the primary region 126. The branches 130 therefore extend to the level of the upper face 112 of the base region 108. Preferably, the branches 130 are in contact with the trench 118 over the entire height of the trench 118 and with the regions 132 over the entire height (thickness) of the regions 132. The branches 130 are mechanically and electrically connected with the primary part 126 by the lower part of the branches 130.

The collector region 104 is made from a semiconductor material, in this example P-doped, for example made from P-doped silicon. The collector region is, for example, doped with boron or indium. The doping of the collector region is, for example, between about $5*10^{17}$ and about $10^{18}$ dopants/cm$^3$.

The dimensions, in a plane parallel to the upper face of the substrate, of the primary part 126 are greater than the dimensions, in a parallel plane, of the secondary part 128, for example at least ten times greater.

The device 100 comprises an isolating wall 134. The isolating wall 134 is, for example, a wall of the DTI (Deep Trench Isolation) type. The isolating wall 134 extends more deeply than the isolating wall 118. The isolating wall 134 extends from the upper face 110 of the substrate. Preferably, the isolating wall 134 extends at least to the lower face of the primary part 126 of the collector region 104. Preferably, the isolating wall 134 extends more deeply than the lower face of the primary part 126 of the collector region 104.

The height (thickness) of the isolating wall 134 is, for example, between about 3 μm and about 5 μm, preferably equal to about 4 μm.

The isolating wall 134 extends along the connecting branches 130. The isolating wall 134 is preferably in contact with the connecting branches 130, preferably over the entire height of the branches 130.

The isolating wall 134 preferably surrounds the connecting branches 130. The isolating wall 134 preferably forms a ring around the connecting branches 130. The isolating wall 134 is located on the side of the connecting branches 130 of the collector region opposite the base region 108. The wall 134 is separated from the isolating trench 118 by the branches 130.

The lower face of the collector region 104, that is to say, the primary part and the branches, is, for example, located in contact with the substrate, for example in contact with a non-doped semiconductor material portion. The isolating wall 134 preferably extends in the non-doped semiconductor material portion.

The emitter region 106 is, in this example, a region made from a P-doped semiconductor material, for example P-doped silicon. The emitter region 106 is located on the base region 108. The emitter region is in contact with the base region 108. The emitter region is more specifically in contact with the upper face of the base region 108, by its lower face. The lower face of the emitter region is preferably coplanar with the upper face 110 of the substrate. The lower face of the emitter region is preferably coplanar with the upper face of the base region.

Preferably, the emitter region is substantially located at the center of the upper face of the base region. For example, each lateral surface of the emitter region is substantially equidistant from one of the lateral surfaces of the base region.

The lateral surfaces of the emitter region are preferably covered by spacers 138. The spacers 138 are made from an isolating material. Each surface of the emitter region is covered by a spacer. The spacers 138 therefore cover the lateral surfaces of the emitter region and part of the upper face of the base region.

The emitter region 106 preferably does not cover the entire base region. Thus, zones 140 of the upper face of the base region are not covered by the emitter region or by the spacers 138. Preferably, each spacer is separated from a lateral surface of the base region by one of the zones 140. The zones 140 preferably form a ring around the emitter region.

The emitter region, for example, has a height (thickness) of between about 50 and about 100 nm. The width of the emitter is, for example, between about 150 nm and about 250 nm, preferably substantially equal to 200 nm.

The emitter region 106 is made from a P-doped semiconductor material. The region 106 is, for example, made from silicon. The region 106 is, for example, doped with boron. The region 106 is preferably doped with boron and carbon. The doping of the emitter region is, for example, between about $5*10^{19}$ and about $10^{20}$ dopants/cm$^3$.

The upper faces of the emitter region 106, and connecting branches of the collector region 104 and the zones 140 are covered, at least partially, preferably completely, by conductive pads 136. The connecting pads 136 are thus located on the upper faces 110 of the substrate, across from the upper faces of the emitter region 106, connecting branches 130 of the collector region 104, and zones 140.

In a variant, at least certain connecting branches may not extend to the upper face 110 of the substrate. These branches are then separated from the connecting pads, located on the upper face 110 of the substrate, by portions, not shown, of semiconductor material, for example portions of the substrate. The portions not shown are preferably not doped. The portions not shown are not doped of the conduction type opposite the type of the corresponding branch. The portions not shown extend, for example, over a height of less than 10% of the height of the branch.

The upper face 110 of the substrate, the emitter region and the spacers are covered by an insulating layer 142. The insulating layer 142 is at least partially passed through by conductive vias 144. The vias 144 are in contact with the connecting pads 136. Each pad 136 is in contact with a via. The isolating layer 142 in particular covers the isolating trench 118, the isolating wall 134 and the conductive pads 136, with the exception of the part of the pads 136 in contact with the vias 144.

Figure 2:
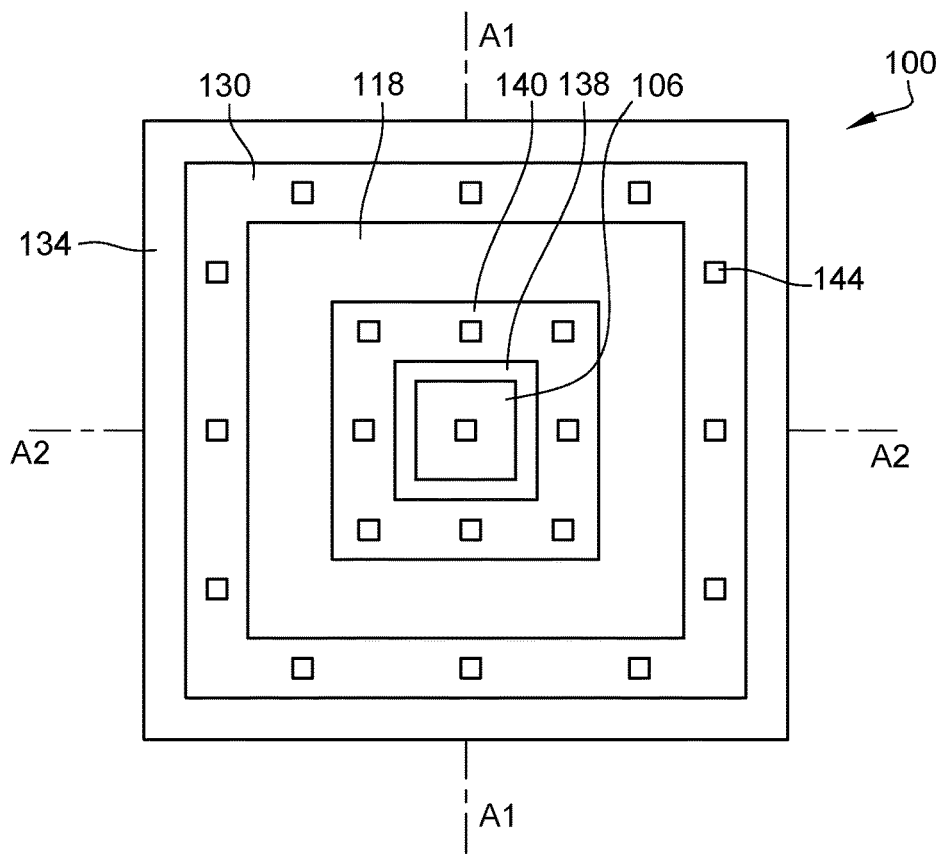
FIG. 2 is an exemplary top view of the embodiment of FIG. 1.

FIG. 2 is an exemplary top view of the embodiment of FIG. 1. FIG. 1, for example, corresponds to a view along plane A1-A1 or along plane A2-A2 of FIG. 2.

FIG. 2 comprises elements identical to the elements of FIG. 1, which will not be described in detail again. In the example of FIG. 2, the connecting pads 136 and the isolating layer 142 are not shown.

In the example of FIG. 2, the device 100 comprises five substantially concentric rings, the center being the emitter region 106. The spacers 138 form a ring around the emitter region. The zones 140 form a ring around the spacers. The isolating trench 118 forms a ring around the regions 140. The branch 130 of the collector region, forming a continuous wall, forms a ring around the isolating trench 118. The isolating wall 134 forms a ring around the branch 130.

In the example of FIG. 2, the emitter region and the various rings are substantially square-shaped. More generally, the emitter region and the various rings can have other shapes, for example circular, rectangular, triangular, etc.

Figure 3:
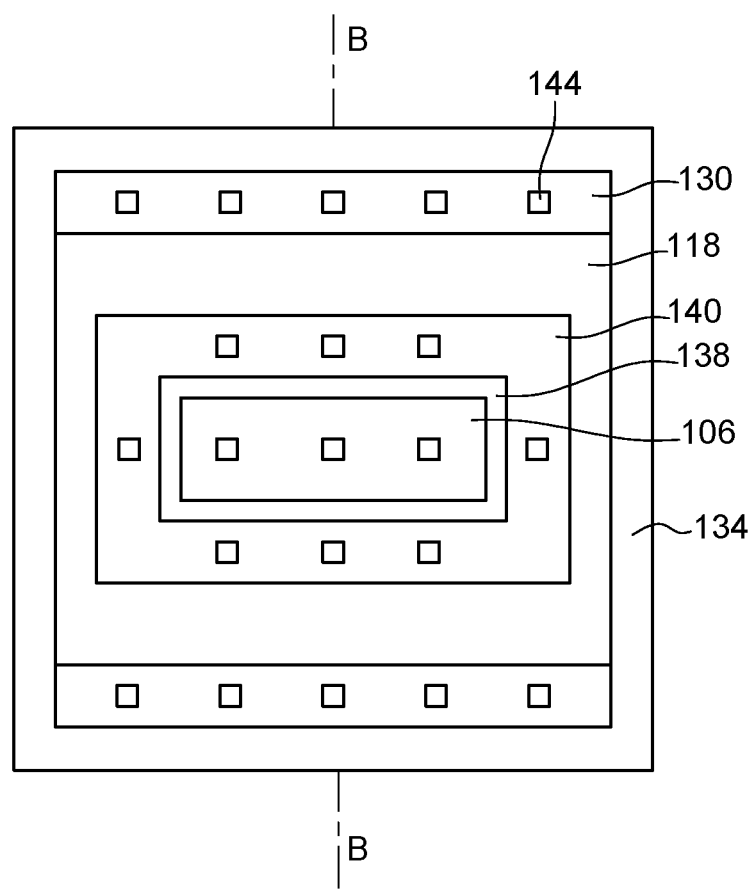
FIG. 3 is another exemplary top view of the embodiment of FIG. 1.

FIG. 3 is another exemplary top view of the embodiment of FIG. 1. FIG. 3 comprises elements identical to the elements of FIG. 1, which will not be described in detail again. FIG. 1, for example, corresponds to a view along plane B-B of FIG. 3. In the example of FIG. 3, the connecting pads 136 and the isolating layer 142 are not shown.

In the view of FIG. 3, the emitter region 106 is substantially rectangular. The emitter region is surrounded by the spacers 138. Likewise, the zones 140 form a ring around the spacers. The isolating trench 118 forms a ring around the regions 140.

In the example of FIG. 3, the device comprises two branches 130 of the collector region.

The branches 130 are located on either side of the isolating trench 118. The branches 130 preferably extend substantially parallel to one another. Each branch 130 extends along a surface of the isolating trench 118. Each branch 130 extends in contact with a surface of the isolating trench 118. The branches 130 are mechanically and electrically connected by the primary part 126, not shown in FIG. 3. The branches 130 are not in direct contact with one another.

The isolating wall 134, for example, surrounds the transistor continuously. The wall 134, for example, extends along the branches 130, on the side opposite the isolating trench 118. The wall 134 also extends in a direction perpendicular to the direction in which the branches 130 extend, along the surfaces of the branches 130 and of the isolating trench 118.

As a variant, the isolating trench can comprise two separate parts extending on either side of the zones 140.

The base region can then extend from one surface of the wall 134 to another opposite surface of the wall 134. The base region is nevertheless surrounded by isolating material. The base region is therefore surrounded, on certain sides, here two opposite sides, by the trench parts and on two other sides, here two other opposite sides, by the isolating wall 134.

The parts of the trench 118 can extend in the same direction as the branches 130. Each branch 130 is therefore separated from the base region by a part of the isolating trench.

FIGS. 4 to 11 show steps, preferably successive, of a method for manufacturing the embodiment of FIG. 1. The method of FIGS. 4 to 11 can apply to the example of FIG. 2 and the example of FIG. 3.

Figure 4:
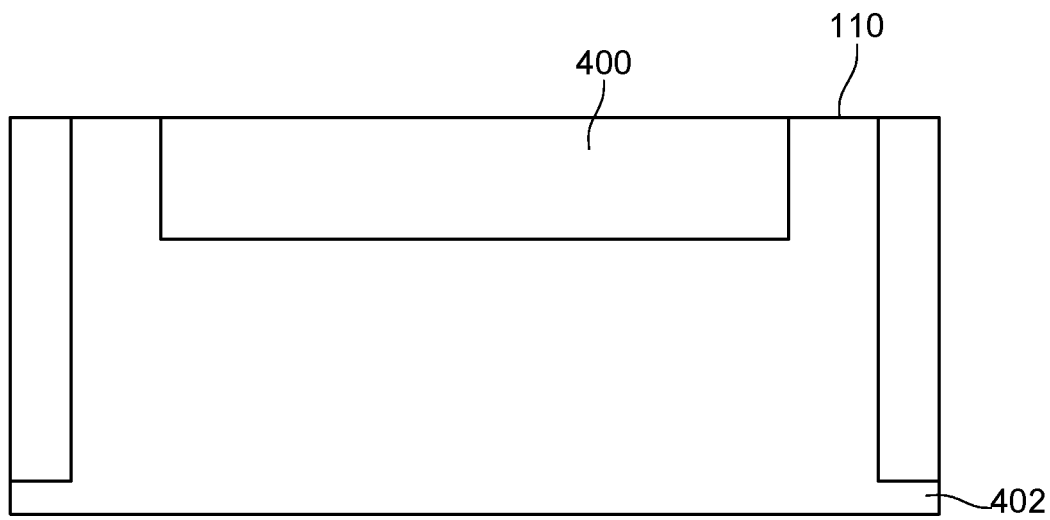
FIG. 4-11 show steps of a method for manufacturing the embodiment of FIG. 1.

FIG. 4 shows a step of a method for manufacturing the embodiment of FIG. 1. During the step shown by FIG. 4, an isolating trench 400 is formed in a substrate 402.

The substrate 402 is a non-doped semiconductor substrate, for example made from silicon.

The isolating trench 400 is a trench of the SSTI (Super Shallow Trench Isolation) type. The trench 400 is located in the location where the trench 118 and the base region 108 will subsequently be located. The trench 400 is continuous in this step of the method, that is to say, it does not comprise an opening. The trench 400 is, for example, parallelepiped.

The trench 400 extends from the upper face of the substrate 402 toward the inside of the substrate. The upper face of the isolating trench is substantially coplanar with the upper face 110 of the substrate.

The trench 400, for example, has a height (thickness) of between about 50 and about 100 nm. The width of the trench 400 is, for example, greater than 500 nm, for example between about 500 nm and about 1000 nm, preferably substantially equal to 750 nm.

During the step shown by FIG. 4, the isolating wall 134 is thus formed. The dimensions of the wall 134 are as they were described in relation with FIG. 1. Likewise, the position of the wall 134 is as it was described in relation with FIG. 1.

Figure 5:
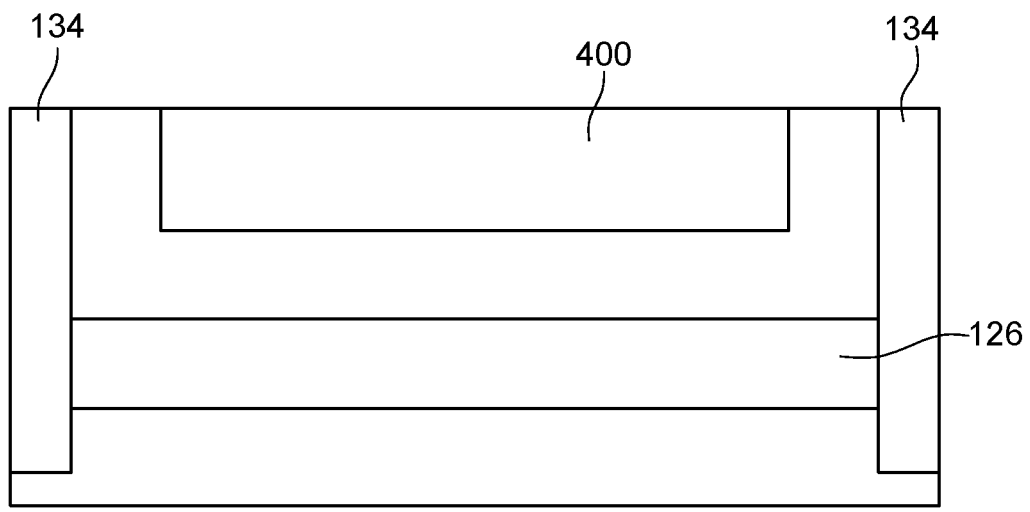

During the step shown by FIG. 5, the primary part 126 of the collector region is formed. The primary part 126 is formed by dopant implantation. The implanted dopants are, for example, boron or indium. The primary part 126 is therefore of type P.

The doping of the primary part 126 of the collector region is, for example, between about $5*10^{17}$ and about $10^{18}$ dopants/cm$^3$.

The primary part 126 and the isolating trench 400 are separated by a distance, for example, of between about 50 and about 150 nm, for example substantially equal to 100 nm. The primary part 126 and the trench 400 are separated by a height preferably greater than or equal to the height provided for the secondary part 128 (FIG. 1).

The primary part 126 is a continuous layer. The primary part 126 extends at least below the isolating trench 400. The primary part 126 preferably extends until reaching the inner lateral surface of the isolating wall 134. Preferably, all of the lateral surfaces of the primary part 126 are in contact with the inner lateral surface of the wall 134. The inner lateral surface of the insulating wall 134 is the lateral surface closest to the insulating trench 400.

One advantage of the described embodiment is that the doping of the primary part 126 can be substantially constant below the insulating trench 400.

Figure 6:
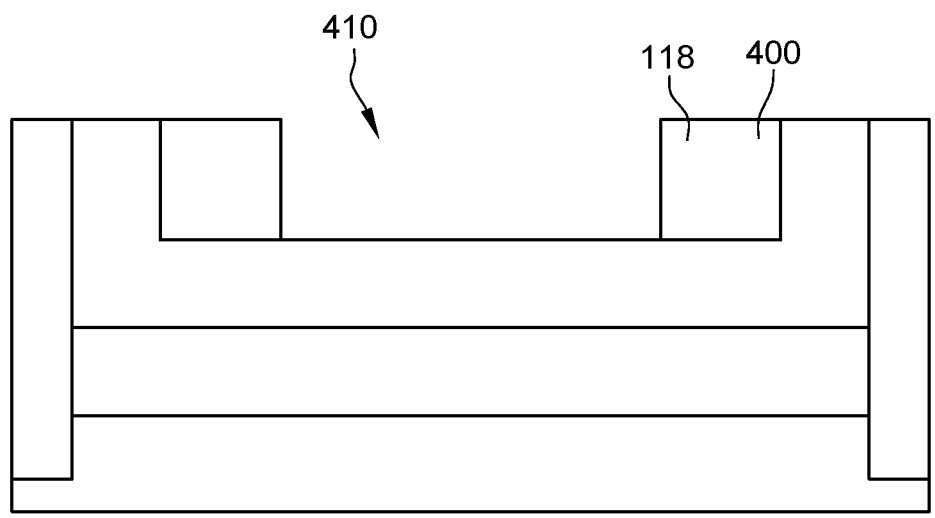

FIG. 6 shows a step of a method for manufacturing the embodiment of FIG. 1, preferably following the steps of FIGS. 4-5. In particular, FIG. 6 shows a step where an opening 410 is formed in the isolating trench 400. The trench 400 therefore corresponds, after this step, to the trench 118 of FIG. 1. The opening 410 passes through the trench 400.

The opening 410 extends from the upper face of the trench 400 to the lower face of the trench 400.

The horizontal dimensions of the opening, that is to say, the dimensions in a plane parallel to the upper face 110 of the substrate, are equal to the desired horizontal dimensions of the base region.

The opening 410 is located in the trench 400. The trench 400 therefore surrounds the opening 410. Preferably, the opening is located substantially equidistant from the outer lateral surfaces of the trench 400. Outer lateral surfaces refer to the lateral surfaces closest to the isolating wall 134.

Figure 7:
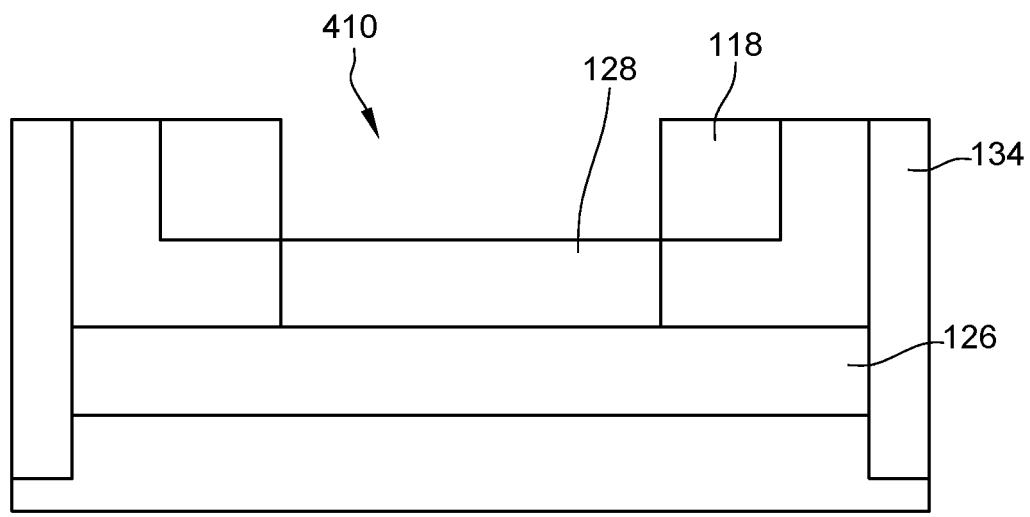

During the step illustrated by FIG. 7, the secondary part 128 of the collector region is formed. The secondary part 128 is formed by implanting dopants through the opening 410. The isolating trench 118 therefore serves as a mask during the implantation. The horizontal dimensions of the secondary part 128 are therefore substantially equal to the horizontal dimensions of the opening 410.

The doping of the secondary part 128 of the collector region is, for example, between about $5*10^{17}$ and about $10^{18}$ dopants/cm$^3$.

The secondary part 128 extends from the upper face of the primary part 126 and toward the opening 410. Preferably, the secondary part 128 extends from the upper face of the primary part 126 to the bottom of the opening, that is to say, to the exposed part of the substrate during the formation of the opening 410.

As a variant, the secondary part may not extend to the bottom of the cavity 410. Preferably, the secondary part extends over at least half of the distance between the upper face of the primary part 126 and the bottom of the cavity 410. Preferably, the distance separating the upper face from the region 128 and the bottom of the cavity 410 is, for example, less than 15 nm.

Figure 8:
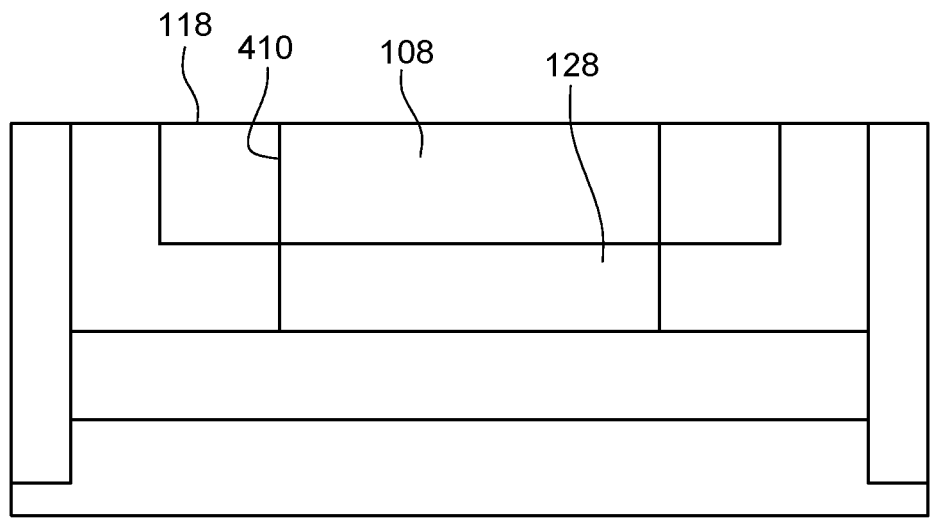

FIG. 8 shows a further step of a method for manufacturing the embodiment of FIG. 1, preferably following the steps of FIGS. 6-7. In particular, FIG. 8 shows a step where the base region 108 is formed in the opening 410. The region 108 is formed by epitaxy. This step therefore comprises the epitaxial growth of the material in the base region 108 in the opening 410. The material of the region 108 is an N-doped semiconductor material, for example doped with arsenic or phosphorus. The material of the region 106 is, for example, silicon. The material of the base region is preferably SiGe. The transistor is then a heterojunction transistor.

The region 108 preferably extends in the entire opening 410. The region 108 preferably extends from the upper face of the exposed part of the substrate during the formation of the opening 410 to the upper face of the substrate. The region 108 is preferably in contact with the entire inner lateral surface of the trench 400. Inner lateral surface of the trench 118 refers to the lateral surface furthest from the wall 134.

Figure 9:
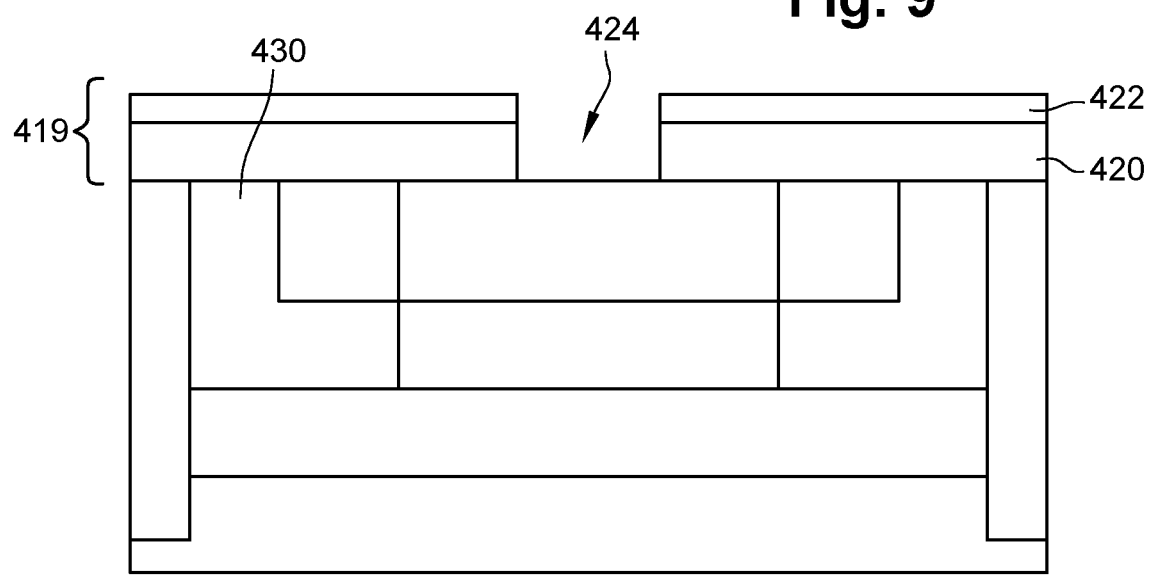

During the step illustrated by FIG. 9, a stack 419 of isolating layers comprising one or several isolating layers is formed on the upper face of the substrate. In the example of FIG. 9, two isolating layers 420 and 422 are formed on the upper surface of the substrate. More specifically, the layer 420 is formed on the upper faces of the base region, the isolating trench 118, and the semiconductor material parts. The layer 422 is formed on the layer 420.

The layer 420 is, for example, made from silicon nitride and the layer 422 is, for example, made from silicon oxide.

An opening 424 is formed in the layers 420 and 422. The opening passes through the layers 420 and 422. The opening extends from the upper face of the layer 422, that is to say, the face furthest from the substrate, to the upper face of the base region 108. The bottom of the opening is thus a part of the upper face of the base region. The opening 424 is located in the location of the emitter region 106. The dimensions of the opening substantially correspond to the dimensions of the emitter region.

Figure 10:
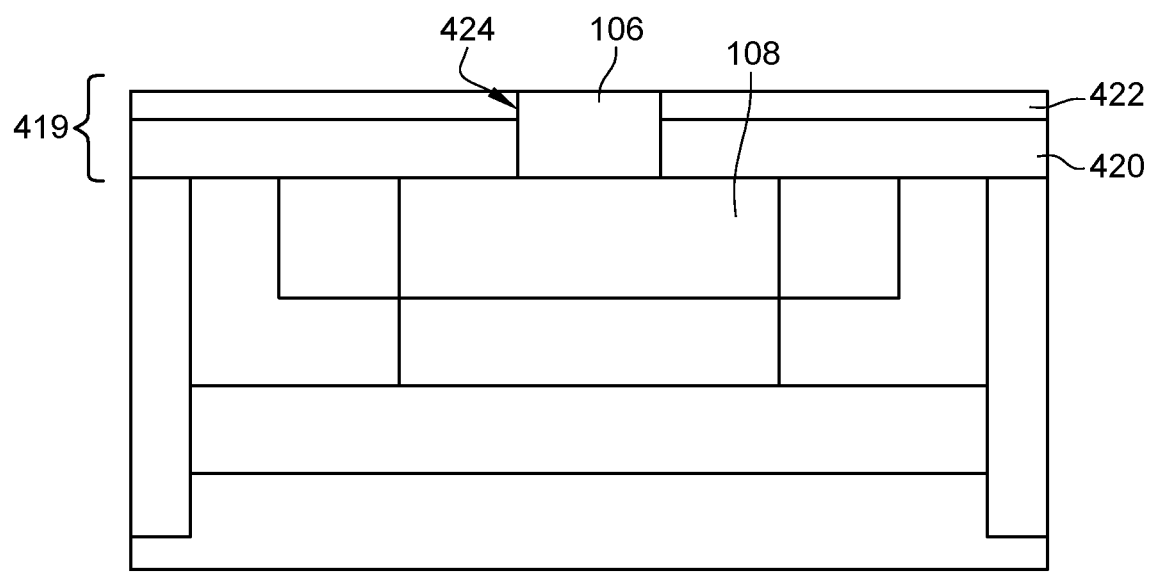

Different manufacturing steps for elements not shown can be carried out, for example before the step of FIG. 10. For example, steps for manufacturing other types of transistors can be carried out, for example inserted between manufacturing steps of the transistor 102. These manufacturing steps optionally comprise heating and annealing steps, which can cause the diffusion of the dopants.

In the case where the secondary part 128 does not extend to the base region, the heating and annealing steps make it possible to diffuse the dopants from the secondary part 128 until reaching the base region. The secondary part 128 is then in contact with the primary part 126 and the base region.

The dopants of the primary region 126 can diffuse in the region 132. The distance between the primary part 126 and the trench 118 can therefore decrease. Likewise, the height of the secondary part 128 of the collector region can decrease, the height of the primary part being increased. This is not shown in FIG. 10.

The dopants of the primary part 126 can then diffuse in portions 430 so as to at least partially form the branches 130 of the collector region. The portions 430 are the portions of the substrate located between the isolating wall 134 and the trench 118. The portions 430, for example, extend between the upper face of the substrate and the upper face of the primary part 126. The dopants of the primary part 126 can, for example, be diffused in the lower part of the portions 430.

FIG. 10 shows a further step of a method for manufacturing the embodiment of FIG. 1, preferably following the steps of FIGS. 8-9. In particular, FIG. 10 shows a step where the emitter region 106 is formed in the opening 424. The region 106 is formed by epitaxy. This step therefore comprises the epitaxial growth of the material in the emitter region 106 in the opening 424. The material of the region 106 is a P-doped semiconductor material, for example doped with boron and carbon or with boron. The material of the region 106 is, for example, silicon.

The region 106 preferably extends in the entire opening 424. The region 106 preferably extends from the upper face of the base region to the upper face of the stack of isolating layers. The region 106 is preferably in contact with the entire inner lateral surface of the stack of isolating layers.

Figure 11:
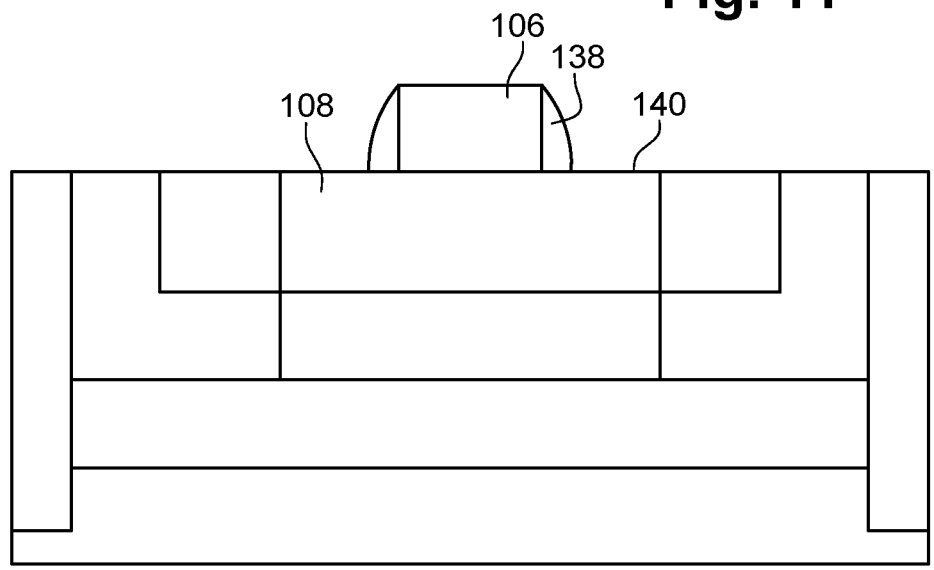

During the step illustrated by FIG. 11, the stack of isolating layers is removed. The layers 420 and 422 are thus removed.

The spacers 138 are next formed on the lateral surfaces of the emitter region 106.

The dimensions of the spacers 138 depend on the height of the emitter region 106. The size of the emitter region 106 is chosen based on the number and dimensions of the layers of the stack of isolating layers. To prevent the diffusion of the boron atoms toward the connecting pads of the base region during the heating or annealing steps, which would decrease the performance of the transistor, the distance between the zones 140 and the emitter region 106 must be large enough. The height of the stack of isolating layers must therefore be large enough. For example, the width of the spacers, that is to say, the distance between the zones 140 in the emitter region, that is to say, the size of the spacers in the horizontal direction in the plane of FIG. 11, is greater than about 40 nm.

Steps, not illustrated, can also be carried out so as to form the embodiment of FIG. 1. In particular, steps for implanting dopants can be added so as to finish the formation of the branches 130. These implantation steps can, for example, correspond to implantation steps in methods for forming other components, for example other transistors. Preferably, the branches 130 extend to the upper face of the substrate. Optionally, the branches 130 do not extend to the surface of the substrate.

The manufacturing method of the embodiment of FIG. 1 can also comprise a siliciding step. A layer of nickel-silicon (NiSi) is thus formed on the upper faces, therefore the exposed faces, of the branches 130, the zones 140 and the emitter region 106. Connecting pads are next formed on the nickel-silicon layers of the upper faces of the branches 130, the zones 140 and the emitter region 106.

The isolating layer 138 can next be formed on the upper face of the substrate and on the emitter region. The conductive vias 140 can next be formed through the isolating layer so as to reach the pads 136.

Figure 12:
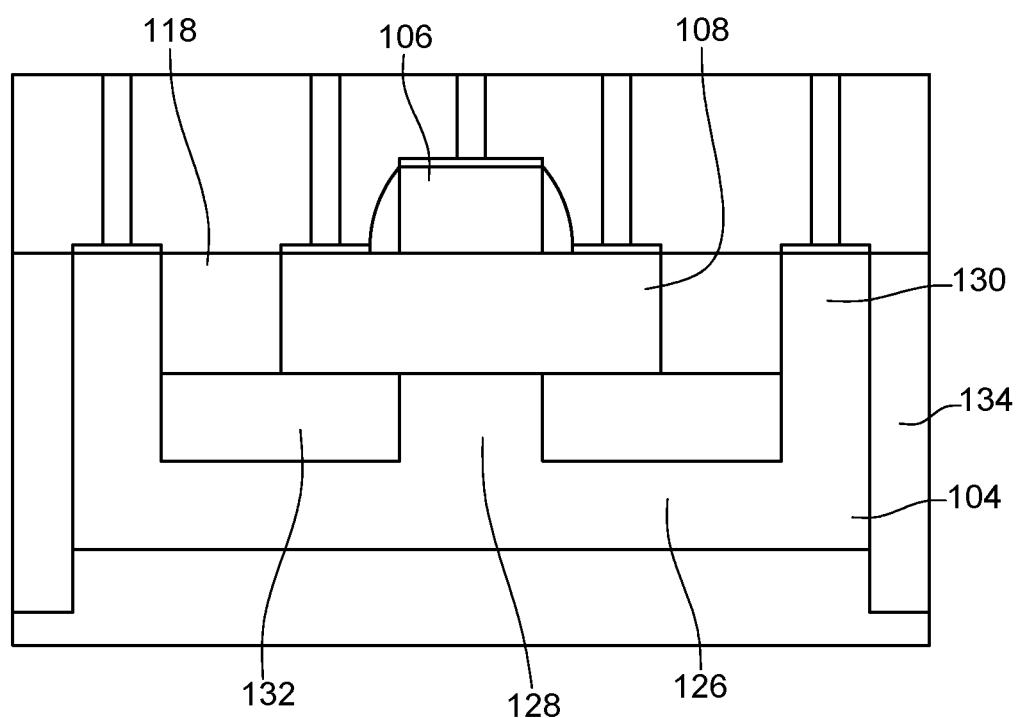
FIG. 12 shows another embodiment of a device comprising a transistor.

FIG. 12 shows another embodiment of a device comprising a transistor.

The embodiment of FIG. 12 is identical to the embodiment of FIG. 1, with the exception of the secondary part 128 of the collector region 104. More specifically, the horizontal dimensions of the secondary part 128 of the collector region 104 are substantially equal to the horizontal dimensions of the emitter region 106.

The secondary part 128 is located facing the emitter region 106. The dimensions, in a plane parallel to the upper face 110 of the substrate, of the emitter region and the secondary part 128 are substantially equal. The emitter region 106 and the secondary part 128 of the collector region 104 are therefore substantially aligned. In other words, each lateral surface of the emitter region is substantially aligned with a lateral surface of the secondary part 128. Each lateral surface of the emitter region is therefore substantially in a same plane as a lateral surface of the secondary part 128.

The dimensions, in a plane parallel to the upper face of the substrate, of the primary part 126 of the collector region 104 are greater than the dimensions, in a parallel plane, of the secondary part 128, for example at least four times greater.

The top view of the embodiment of FIG. 12 can correspond to FIG. 2 or FIG. 3.

Figure 13:
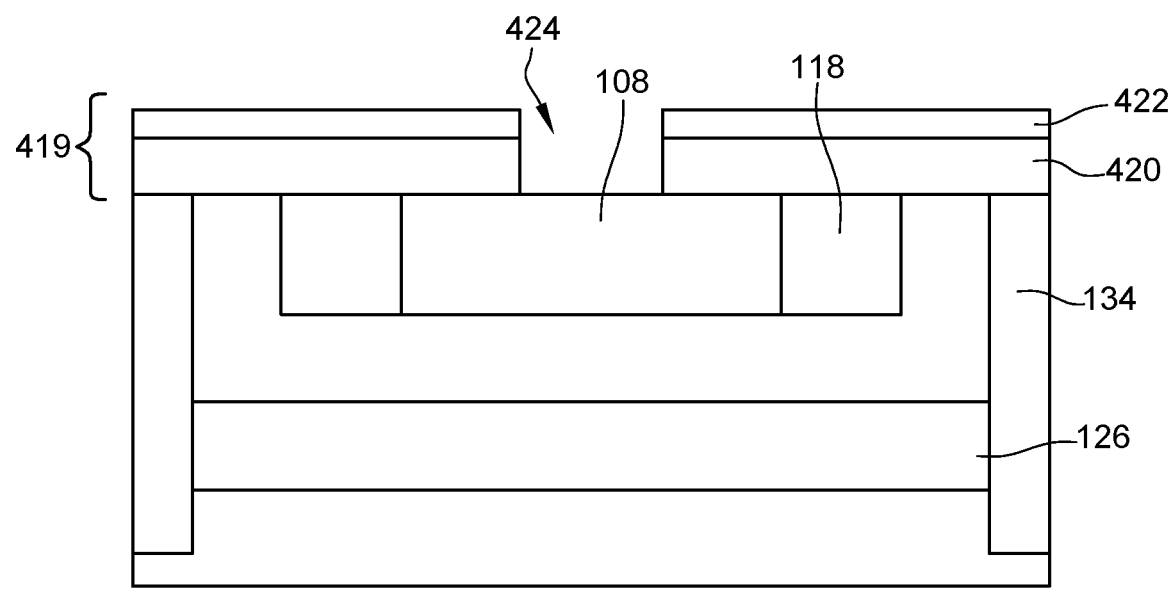
FIGS. 13-14 shows steps of a method for manufacturing the embodiment of FIG. 12.
Figure 14:
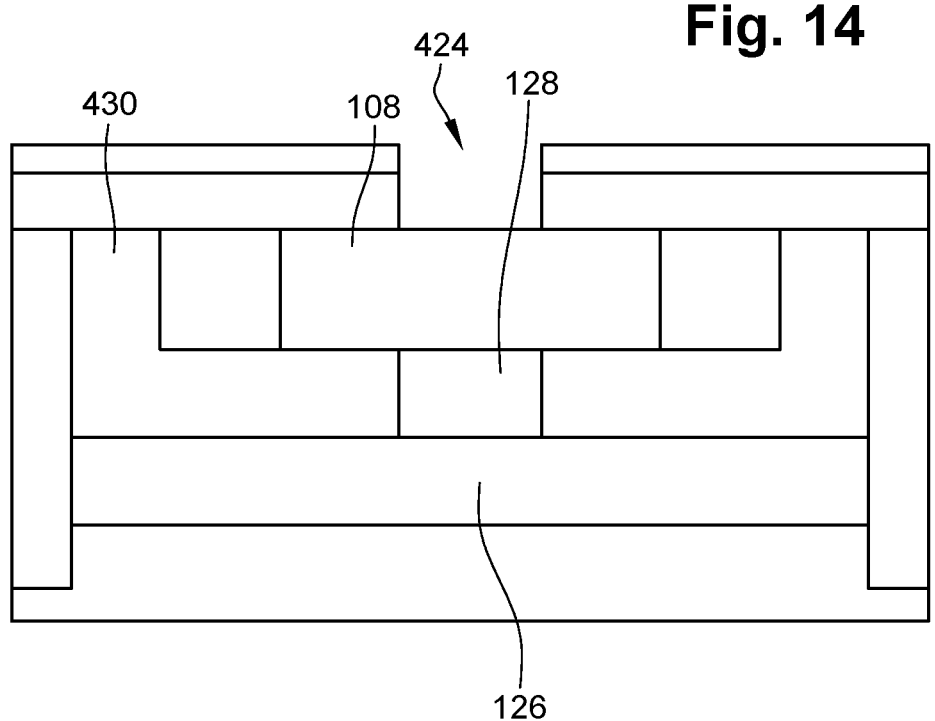

FIGS. 13-14 show steps of a method for manufacturing the embodiment of FIG. 12. In particular, FIG. 13 shows a step which is the result of several steps previously described. More specifically, FIG. 13 results from the steps of FIGS. 4-6, 8 and 9. FIG. 13 therefore results from the formation of the isolating trench 400, the formation of the isolating wall 134, the formation of the primary part 126 of the collector region 104, the opening of the trench 400 so as to form the trench 118, the formation of the base region 108, the formation of the stack of isolating layers and the formation of the opening 424 in the stack of layers.

The step illustrated by FIG. 7 is not performed. The secondary part 128 is therefore not yet formed in the step shown by FIG. 13. The secondary part 128 is therefore not formed before the formation of the base region. The base region 108 is therefore separated from the primary part of the collector region by a portion of semiconductor material, preferably not doped, for example a portion of the substrate. Preferably, the entire lower face of the base region 108 is separated from the collector region by the portion of semiconductor material.

During the step illustrated by FIG. 14, the secondary part 128 is formed.

The secondary part 128 is formed by implanting dopants through the opening 424. The stack of isolating layers therefore serves as mask during the implantation. The horizontal dimensions of the secondary part 128 are therefore substantially equal to the horizontal dimensions of the opening 424.

The doping of the secondary part 128 of the collector region is, for example, between about $5*10^{17}$ and about $10^{18}$ dopants/cm$^3$.

The secondary part 128 extends from the upper face of the primary part 126 and toward the base region. Preferably, the secondary part 128 extends from the upper face of the primary part 126 and to the base region. The secondary part 128 is thus in contact with the primary part 126 and with the base region.

As a variant, the secondary part may not extend to the base region. Preferably, the secondary part extends over at least half of the distance between the upper face of the primary part 126 and the lower face of the base region. Preferably, the distance separating the upper face of the region 128 and the lower face of the base region is, for example, less than 15 nm. The upper face of the primary part 126 and lower face of the base region are the faces of the primary part 126 and of the base region that are closest to one another.

The manufacturing method of the embodiment of FIG. 12 comprises steps that are not shown. In particular, the method may comprise the steps described in relation with FIGS. 10-11. The method may therefore comprise the formation of the emitter region and the opening 424, the formation of the spacers, siliciding, the formation of the pads 136, the formation of the isolating layer 142 and the formation of the vias 144.

Additionally, steps for manufacturing other types of transistors can be carried out, for example inserted between manufacturing steps of the transistor of FIG. 12. These manufacturing steps optionally comprise heating and annealing steps, which can cause the diffusion of the dopants.

In the case where the secondary part 128 does not extend to the base region, the heating and annealing steps make it possible to diffuse the dopants from the secondary part 128 until reaching the base region. The secondary part 128 is then in contact with the primary part 126 and the base region.

Thus, the dopants of the primary region 126 can diffuse in the region 132. The dopants of the primary part 126 can then diffuse in portions 430 so as to at least partially form the branches 130 of the collector region. The dopants of the primary part 126 can for example be diffused in the lower part of the portions 430.

One advantage of the described embodiments is that the formation of the base region by epitaxy makes it possible to better control the doping of the base region than when the base region is formed by implantation.

Another advantage of the described embodiments is that the formation of the base region by epitaxy makes it possible to form a base region made from SiGe, which makes it possible to improve the performance of the transistor.

Another advantage of the described embodiments is that a single mask is used to form the collector region and the base region, for the embodiment of FIG. 1, and to form the collector region and the emitter region for the embodiment of FIG. 12.

Another advantage is that the described embodiments have a stray capacitance at the interface between the base region and the collector region lower than that which would have been present if the primary part 126 was in direct contact, without the secondary part 128.

Various embodiments and variants have been described. Those skilled in the art will understand that certain features of these embodiments can be combined and other variants will readily occur to those skilled in the art. In particular, although the examples given in connection with figures comprise a PNP transistor, the embodiments also apply to NPN transistors. The types of conductivity are then reversed, P becoming N and N becoming P. The dopants of the different regions are also changed, for example exchanged with the dopants described for the opposite type of conductivity.

Likewise, although the examples given in connection with figures comprise a PNP transistor whose collector region is buried more deeply than the emitter region, the emitter and collector regions can be reversed.

Finally, the practical implementation of the embodiments and variants described herein is within the capabilities of those skilled in the art based on the functional description provided hereinabove.

The invention claimed is:

1. A method for forming a device comprising a bipolar transistor, comprising:
    forming an isolating trench in a semiconductor substrate;
    implanting dopants to form a primary part of a collector region of the bipolar transistor buried in the semiconductor substrate below the isolating trench;
    forming a first opening in the isolating trench which extends through the isolating trench to reach said semiconductor substrate;
    implanting dopants through said first opening to form a secondary part of the collector region of the bipolar transistor extending over said primary part; and
    epitaxially growing a base region of the bipolar transistor in the first opening and laterally surrounded by said isolating trench.

2. The method according to claim 1, further comprising:
    forming an emitter region of the bipolar transistor on the base region; and
    forming an insulating spacer on each lateral surface surfaces of the emitter region.

3. The method according to claim 2, wherein a width of each insulating spacer is greater than about 40 nm.

4. The method according to claim 2, further comprising:
    forming a stack of at least one isolating layer on the base region; and
    forming a second opening in the stack;
    wherein forming the emitter region comprises epitaxially growing said emitter region in the second opening.

5. The method according to claim 4, further comprising removing the stack and wherein forming the insulating spacer comprises forming spacers on each lateral surface of the emitter region.

6. The method according to claim 5, wherein a width of each spacer is greater than about 40 nm.

7. The method according to claim 1, further comprising forming a deep trench isolation surrounding the bipolar transistor, said deep trench isolation having a depth in the semiconductor substrate which is greater than a depth of the isolating trench.

8. The method according to claim 1, wherein said semiconductor substrate is made of a non-doped semiconductor material.

9. The method according to claim 8, wherein portions of the non-doped semiconductor material laterally surround the secondary part of the collector.

10. A method for forming a device comprising a bipolar transistor, comprising:
    forming an isolating trench in a semiconductor substrate;
    implanting dopants to form a primary part of a collector region of the bipolar transistor buried in the semiconductor substrate below the isolating trench;
    forming a first opening in the isolating trench which extends through the isolating trench to reach said semiconductor substrate;
    epitaxially growing a base region of the bipolar transistor in the first opening and laterally surrounded by said isolating trench;
    forming a stack of at least one isolating layer on the base region;
    forming a second opening extending through the stack;
    implanting dopants through said second opening to form a secondary part of the collector region of the bipolar transistor in the semiconductor substrate between said primary part and the base region; and
    epitaxially growing an emitter region of the bipolar transistor in said second opening.

11. The method of claim 10, further comprising removing the stack.

12. The method of claim 11, further comprising forming an insulating spacer on each lateral surface of the emitter region.

13. The method of claim 12, wherein a width of each insulating spacer is greater than about 40 nm.

14. The method of claim 10, further comprising forming a deep trench isolation surrounding the bipolar transistor, said deep trench isolation having a depth in the semiconductor substrate which is greater than a depth of the isolating trench.

15. The method of claim 10, wherein said semiconductor substrate is made of a non-doped semiconductor material.

16. The method according to claim 15, wherein portions of the non-doped semiconductor material laterally surround the secondary part of the collector.

\* \* \* \* \*